United States Patent [19]

Lee et al.

[11] Patent Number: 5,732,002
[45] Date of Patent: Mar. 24, 1998

[54] MULTI-RATE IIR DECIMATION AND INTERPOLATION FILTERS

[75] Inventors: Wai L. Lee, Wilmington, Mass.; Tom W. Kwan, Milpitas, Calif.

[73] Assignee: Analog Devices, Inc., Norwood, Mass.

[21] Appl. No.: 447,746

[22] Filed: May 23, 1995

[51] Int. Cl.⁶ .............................. G06F 17/17; G06F 17/10
[52] U.S. Cl. .............................. 364/724.1; 364/724.17
[58] Field of Search .................. 364/724.17, 724.1

[56] References Cited

U.S. PATENT DOCUMENTS

| | | | |
|---|---|---|---|
| 3,988,689 | 10/1976 | Ochi et al. | 330/9 |
| 4,138,649 | 2/1979 | Schaffer | 330/9 |
| 4,179,670 | 12/1979 | Kingsbury | 331/10 |
| 4,246,571 | 1/1981 | Gariazzo | 340/347 |
| 4,281,318 | 7/1981 | Candy et al. | 340/347 |
| 4,400,637 | 8/1983 | Klar et al. | 307/497 |
| 4,574,250 | 3/1986 | Senderowicz | 330/258 |
| 4,633,223 | 12/1986 | Senderowciz | 330/347 |
| 4,709,375 | 11/1987 | Robinton et al. | 375/27 |
| 4,797,845 | 1/1989 | Stikvoort | 364/724.1 |
| 4,851,841 | 7/1989 | Sooch | 341/143 |
| 4,905,005 | 2/1990 | Arribard et al. | 341/139 |
| 4,937,577 | 6/1990 | Rich et al. | 341/143 |
| 4,939,516 | 7/1990 | Early | 341/143 |
| 4,953,117 | 8/1990 | Lagadec | 364/724.1 |
| 4,954,824 | 9/1990 | Yamada et al. | 341/61 |
| 4,987,373 | 1/1991 | Soo | 328/155 |
| 4,990,911 | 2/1991 | Fujita et al. | 341/123 |
| 4,999,798 | 3/1991 | McCaslin et al. | 364/724.1 |
| 5,030,954 | 7/1991 | Ribner | 341/172 |
| 5,039,989 | 8/1991 | Welland et al. | 341/143 |
| 5,047,772 | 9/1991 | Ribner | 341/156 |
| 5,065,157 | 11/1991 | Ribner et al. | 341/143 |
| 5,075,679 | 12/1991 | Gazsi | 341/143 |
| 5,084,639 | 1/1992 | Ribner | 307/490 |
| 5,084,702 | 1/1992 | Ribner | 341/143 |
| 5,103,229 | 4/1992 | Ribner | 341/143 |
| 5,111,151 | 5/1992 | Li | 328/155 |

(List continued on next page.)

FOREIGN PATENT DOCUMENTS

| | | |
|---|---|---|
| A-0227172 | 7/1987 | European Pat. Off. |
| A-0320517 | 6/1989 | European Pat. Off. |
| A-0429217 | 5/1991 | European Pat. Off. |
| A-2122822 | 1/1984 | United Kingdom |
| WO92/05739 | 4/1992 | WIPO |
| WO94/00850 | 1/1994 | WIPO |

OTHER PUBLICATIONS

Bellanger, "Digital Processing of Signals", 1984, pp. 280–282.

Chao, Krik C.-H. et al., "A Higher Order Topology for Interpolative Modulators for Oversampling A/D Converters", 8090 IEEE Transactions on Circuits and Systems, 37 (1990) March, No. 3, New York, US.

Craig, "Input Circuit for Analog–To–Digital Light Sensitive Detector", IBM Technical Disclosure Bulletin, Vo. 22, No. 1, Jun. 1979.

"Designer's Reference Manual", Analog Devices Inc. Norwood, Ma, 1996; Section 2, pp. 43–44 and 103–104.

Elliot, Douglas F. & Ramamohan, Rao K., "Fast Transforms, Algorithms, Analyses, Applications", Academic Press, p. 13, 1982.

(List continued on next page.)

*Primary Examiner*—Tan V. Mai
*Attorney, Agent, or Firm*—Wolf, Greenfield & Sacks, P.C.

[57] ABSTRACT

A digital filtering method that includes sampling an input signal at a first rate, integrating the signal, sampling the integrated version at a different rate, and combining the sampled integrated version with the input signal. The method can include again integrating the integrated version, sampling the twice integrated version at a third rate different from the first and second rates, and combining the twice integrated version with the integrated version and the input signal. The integrated version can be again integrated, the twice integrated version can be sampled at a third rate different from the first and second rates, and the twice integrated version can be combined with the integrated version. A common circuit component can be multiplexed to participate in two integrating steps.

48 Claims, 8 Drawing Sheets

U.S. PATENT DOCUMENTS

| | | | |
|---|---|---|---|
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,134,401 | 7/1992 | McCartney et al. | 341/143 |
| 5,142,286 | 8/1992 | Ribner et al. | 341/143 |
| 5,148,166 | 9/1992 | Ribner | 341/143 |
| 5,148,167 | 9/1992 | Ribner | 341/143 |
| 5,157,395 | 10/1992 | Del Signore et al. | 341/143 |
| 5,159,292 | 10/1992 | Canfield et al. | 331/1 A |
| 5,159,341 | 10/1992 | McCartney et al. | 341/143 |
| 5,181,032 | 1/1993 | Ribner | 341/143 |
| 5,204,827 | 4/1993 | Fujita et al. | 364/724.1 |
| 5,227,707 | 7/1993 | Kurashima | 341/61 |
| 5,274,375 | 12/1993 | Thompson | 341/143 |
| 5,283,578 | 2/1994 | Ribner et al. | 341/143 |
| 5,311,181 | 5/1994 | Ferguson, Jr. et al. | 341/143 |
| 5,313,205 | 5/1994 | Wilson | 341/144 |
| 5,331,346 | 7/1994 | Shields et al. | 341/61 |
| 5,334,944 | 8/1994 | Hirakata | 330/6 |
| 5,349,352 | 9/1994 | Saleh | 341/143 |
| 5,353,026 | 10/1994 | Wilson | 341/143 |
| 5,357,248 | 10/1994 | Sasaki | 341/61 |
| 5,363,055 | 11/1994 | Ribner | 330/9 |
| 5,381,148 | 1/1995 | Mueck et al. | 341/139 |
| 5,389,923 | 2/1995 | Iwata et al. | 341/61 |
| 5,392,043 | 2/1995 | Ribner | 341/143 |
| 5,410,270 | 4/1995 | Rybicki et al. | 330/9 |
| 5,483,555 | 1/1996 | Hattori | 375/327 |
| 5,497,152 | 3/1996 | Wilson et al. | 364/724.1 |

OTHER PUBLICATIONS

Gray, Paul R. & Meyer, Robert G., "Analysis and Design of Analog Integrated Circuit, Second Edition by John Wiley & Sons, Inc.," pp. 737–741, 1984.

Hallgreen, B., "Possible Applications of the Signal Delta Digitizer in Particle Physics", Nuclear Instruments and Methods in Physics Research A307 (1991) pp. 436–447.

Higgins, Richard J., "Digital Signal Processing in VLSI", Prentice Hall, Englewood Cliffs, NJ, pp. 29–31, 1990.

Hurst, Paul J. et al., "A Programmable Clock Generator Using Noise Shaping and its Application in a Switched–Capacitor Filter", Solid–State Circuits Research Laboratory, Dept. of Electrical and Computer Engineering University of California, Davis (no dated).

Janssen, J. et al., "A New Principle/IC for Audio Sampling Rate Conversion", Audio Engineering Society, Presented at the 96th Convention Feb. 26–Mar. 1, 1994, in Amsterdam.

Lee, Wai Laing, "A Novel Higher Order Interpolative Modulator Topology for High Resolution Oversampling A/D Converters", Thesis, Massachusetts Institute of Technology, Jun. 1987.

Leung, Bosco, H., "Design Methodology of Decimation Filters for Oversampled ADC Based on Quadratic Programming", IEEE Transactions on Circuits and Systems, vol. 38, No. 10, Oct. 1991.

Lindsey, William C., "A Survey of Digital Phase–Locked Loops", Proceedings of the IEEE, vol. 69, No. 4, Apr. 1981.

Martins R.P. & France, J.E., "A Novel N–TH Order IIRR Switched–Capacitor Decimator Building Block with Optimum Implementation", CH2692–2/89/0000–1471, 1989.

Nagaraj, K. et al., "Reduction of Finite–Gain Effect in Switched–Capacitor Filters", Electronics Letters, vol. 21, No. 15, Jul. 18, 1985.

Nakajima, Osamu et al., "Performance Improvement of DPLL with Adaptive Binary Quantized Phase–Frequency Comparator", Electronics Communications in Japan, Part 1, vol. 73, No. 8, Aug. 1990.

Ping, W. & Franca J.E., "New Form of Realisation of IIR Switched–Capacitor Decimators", Electronics Letters, vol. 29, No. 11 May 27, 1993.

Ribner, David B., et al.; "16b Third–Order Sigma Delta Modulator with Reduced Sensitivity to Nonidealities", ISSCC91, Paper WP 4.3, Digiest of papers, Mar. 1991.

Ribner, David B., et al., "Third–Order Sigma–Delta Modulator with Reduced Sensitivity to Nonidealities", IEEE Journal of Solid–State Circuits, vol. 26, No. 12, Dec. 1991.

Takashi, Tabu, "Gain Control System with Variable Sampling Frequency", Patent Abstracts of Japan, Dec. 1978.

Kester, W., "Sigma–Delta ADCs and DACs", Mixed–Signal Design Seminar, 1991, pp. VI–1–VI–30.

MULTI-RATE IIR DECIMATION AND INTERPOLATION FILTERS

This application is related to two commonly assigned applications, respectively entitled DATA ACQUISITION SYSTEM Ser. No. 08/447,735 and SWITCHED CAPACITOR OFFSET SUPPRESSION Ser. No. 08/447,874, both to Wai Lee, filed on the same day as this application, and herein incorporated by reference.

FIELD OF THE INVENTION

This invention relates generally to IIR filters, and more particularly to such filters for decimation and interpolation filtering.

BACKGROUND OF THE INVENTION

FIG. 1 shows a conventional fourth-order state-variable infinite-impulse-response (IIR) filter 10. This filter includes a summer 12 followed by a series of serially-connected state-variable integrators 14, 16, 18, 20. A series of gain elements 22, 24, 26, 28 respectively receive the outputs of each of these integrators and provide weighted versions of them to a second summer 30. The second summer provides a sum of the weighted outputs to the first summer 12, which subtracts the sum from the input 32 of the filter. The output of the last integrator 20 serves as the output 34 of the filter.

When used as a decimation filter, the input to the filter 32 is sampled at a first data-rate $f_{in}$ and the output 34 of the filter is decimated to a lower data-rate $f_{out}$. Such a filter can also be used for interpolation by first interpolating the input data-rate up to the output data-rate, such as by stuffing 0's between valid input samples or by holding each valid input sample. The filter then removes high frequency components.

In practice, IIR filters such as the structure of FIG. 1 are not often used for decimation or interpolation filtering because the circular nature of the data flow forces almost all computations to be performed at the higher of either the input or output data-rates. Finite-impulse-response (FIR) filters tend to be used instead, because their non-recursive structure allows many computations to be skipped. Decomposition techniques such as those described by Bellanger, in *Digital Processing of Signals*, 1984, pp. 280–282 have been studied to provide some savings in IIR filter computations. In general, however the savings from these techniques are limited to 50% computation load reduction, which is typically not favorable compared to FIR filter implementations where computation requirements are reduced in proportion to the decimation or interpolation ratio.

SUMMARY OF THE INVENTION

In one general aspect, the invention features a digital filtering method that includes sampling an input signal at a first rate, integrating the signal, sampling the integrated version at a different rate, and combining the sampled integrated version with the input signal.

The method can include again integrating the integrated version, sampling the twice integrated version at a third rate different from the first and second rates, and combining the twice integrated version with the integrated version and the input signal. The integrated version can be again integrated, the twice integrated version can be sampled at a third rate different from the first and second rates, and the twice integrated version can be combined with the integrated version. A common circuit component can be time-multiplexed to participate in two or more integrating steps.

In another general aspect, the invention features an IIR filter that includes an integrator, which can be implemented with switched-capacitor circuitry, and a rate adjustor, which can be a decimator or an interpolator. A first circuit path is provided between the input of the rate adjustor and the output of the integrator, and a second path is provided between the output of the rate adjustor and the input of the integrator.

The second path can include a summer with the rate adjustor being a decimator. The integrator can operate at one rate, and the third path can include a gain element that can operate at a different rate. The first path can include a second decimator operatively connected to the integrator and a second integrator operatively connected to the decimator. A fifth path can be provided between the second decimator and the summer, and a sixth path can be provided between the second decimator and the second integrator. The third and fifth paths can include gain elements that operate at different rates. The sixth path can include a third integrator operatively connected to the second decimator and a third decimator operatively connected to the second and third integrators. A seventh path can be provided between the third decimator the summer. The integrators can operate at different rates.

The first path can include a second decimator operatively connected to the integrator. A second summer can be operatively connected to the second decimator and a second integrator can be operatively connected to the first decimator. A fifth path can be provided between the first decimator and the second summer and a sixth path can be provided between the second summer and the second integrator. The sixth path can include a third integrator operatively connected to the second summer, a third decimator operatively connected to the third integrator, and a third summer operatively connected to the third decimator and to the second integrator. A seventh path can be provided between the first decimator and the third summer.

The first path can include a summer, with the rate adjustor being an interpolator. The integrator can operate at one rate and the third path can include a gain element that operates at a different rate. The second path can include a second integrator operatively connected to the interpolator and a second interpolator operatively connected to the integrator. A fifth path can be provided between the second interpolator and the summer, and a sixth path can be provided between the second integrator and the second interpolator. The sixth path can include a third interpolator operatively connected to the second integrator as well as a third integrator operatively connected to the third interpolator and to the second interpolator. A seventh path can be provided between the third interpolator and the summer.

The first path can include a second integrator operatively connected to the interpolator, a second summer operatively connected to the second integrator, and a second interpolator operatively connected to the first integrator. A fifth path can be provided between the first integrator and the second summer, and a sixth path can be provided between the second summer and the second interpolator. The sixth path can further include a third interpolator operatively connected to the third integrator, a third integrator operatively connected to the third interpolator, and a third summer operatively connected to the third integrator and the second integrator. A seventh path can be provided between the first interpolator and the third summer.

IIR decimation and interpolation filters according to the invention can be advantageous in that they may be implemented using less circuitry than prior art IIR filters. And in many cases, they will require less circuitry than FIR filters with similar magnitude responses.

DETAILED DESCRIPTION

Figure 2:
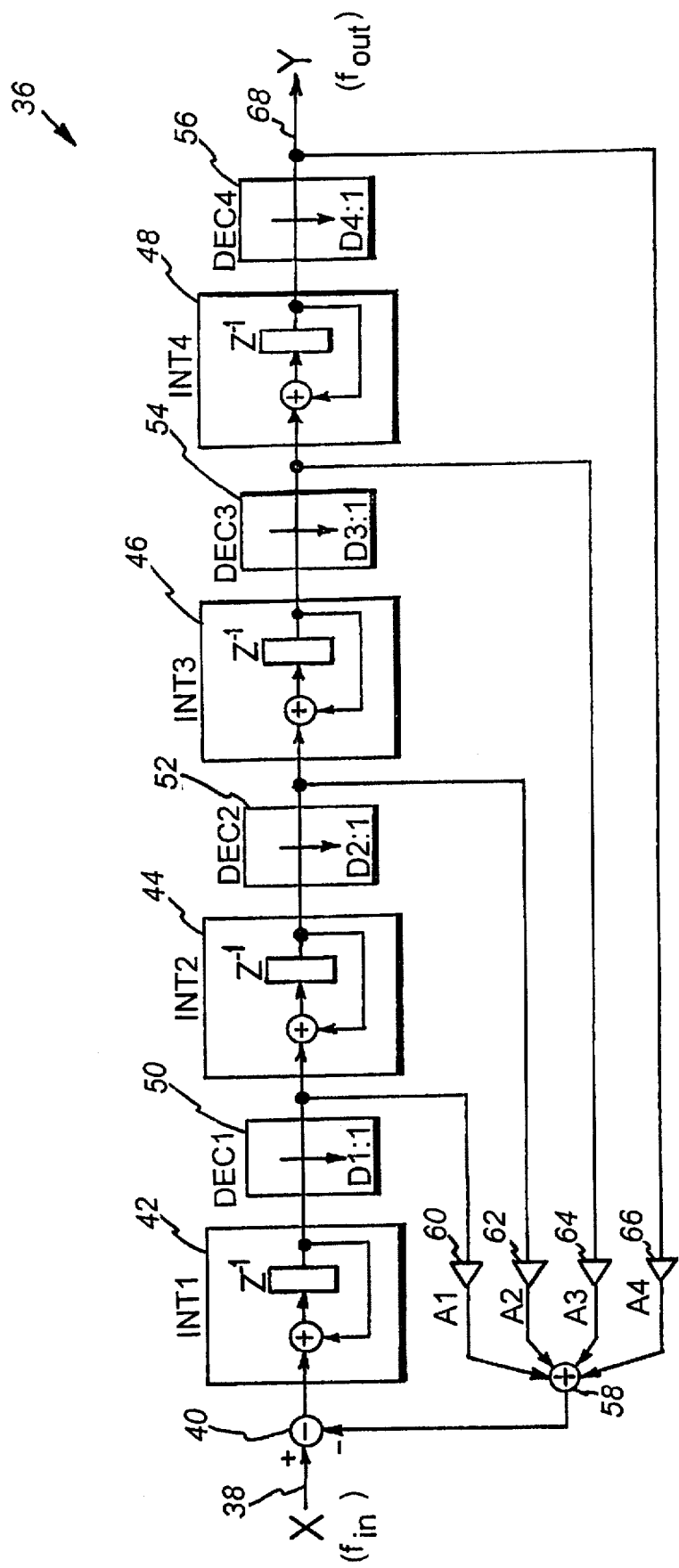
FIG. 2 is a block diagram of a fourth-order IIR decimation filter according to the invention.

Referring to FIG. 2, an illustrative fourth-order IIR decimation filter 36 according to the invention includes an input node 38 that is operatively connected to a non-inverting input of a first summer 40. An output of the summer is operatively connected to an input of a first integrator 42, and an output of this integrator is operatively connected to an input of a first decimator 50. A first gain element 60 has an input operatively connected to the output of the first decimator, and an output operatively connected to a non-inverting input of a second summer 58. The second summer has an output that is operatively connected to an inverting input of the first summer.

Also operatively connected to the output of the first decimator are three further successive integrate-and-decimate stages. In particular, a second integrator 44 has an input operatively connected to the output of the first decimator 50 and an output operatively connected to the input of the second decimator 52. A second gain element 62 has an input operatively connected to the output of the second decimator, and an output operatively connected to a second non-inverting input of the second summer 58. A third integrator 46 has an input operatively connected to the output of the second decimator and an output operatively connected to an input of a third decimator 54. A third gain element 64 has an input operatively connected to the output of the third decimator, and an output operatively connected to a third non-inverting input of the second summer. A fourth integrator 48 has an input operatively connected to the output of the third decimator and an output operatively connected to an input of a fourth decimator 56. A fourth gain element 66 has an input operatively connected to the output of the fourth decimator, and an output operatively connected to a fourth non-inverting input of the second summer. The output of the fourth decimator acts as the output node 68 of the IIR decimation filter 36.

Each of the integrators 42, 44, 46, 48 can be implemented with a switched capacitor circuit. The decimators 50, 52, 54, 56 perform rate reduction (decimation) operations, and can form a part of the circuitry that includes the integrators. The gain elements 60, 62, 64, 66 and summers 40, 58 can also form a part of this circuitry.

The decimation filter 36 takes advantage of the fact that at the output of each of the state-variable integrators 42, 44, 46, 48 the signal is sufficiently low-pass filtered that decimation can be performed incrementally throughout the filter by the decimators 50, 52, 54, 56. For this reason, only the first-stage integrator 42 needs to operate at the high input data-rate. Operations performed for the subsequent stages, including filter coefficient multiplication by the gain elements 60, 62, 64, 66, can be performed at lower decimated data-rates. This can have the effect of dramatically reducing computational requirements.

In one embodiment, the first decimation ratio is 16, the second decimation ratio is 1, the third decimation ratio is 1, and the fourth decimation ratio is 1. The gain for first gain element 60 is $7.84 \times 10^{-3}$, the gain for the second gain element 62 is $3.00 \times 10^{-4}$, the gain for the third gain element 64 is $6.25 \times 10^{-6}$, and the gain for the fourth gain element 66 is $6.40 \times 10^{-8}$.

In practice it is preferable to provide some gain in the integrators 42, 44, 46, 48 themselves to compensate for the incremental decimation or interpolation operations and maintain maximum dynamic range with minimum word widths without affecting overall frequency response characteristics. Providing this gain in the integrators will impact the gain values of the gain elements 60, 62, 64, 66.

Figure 3:
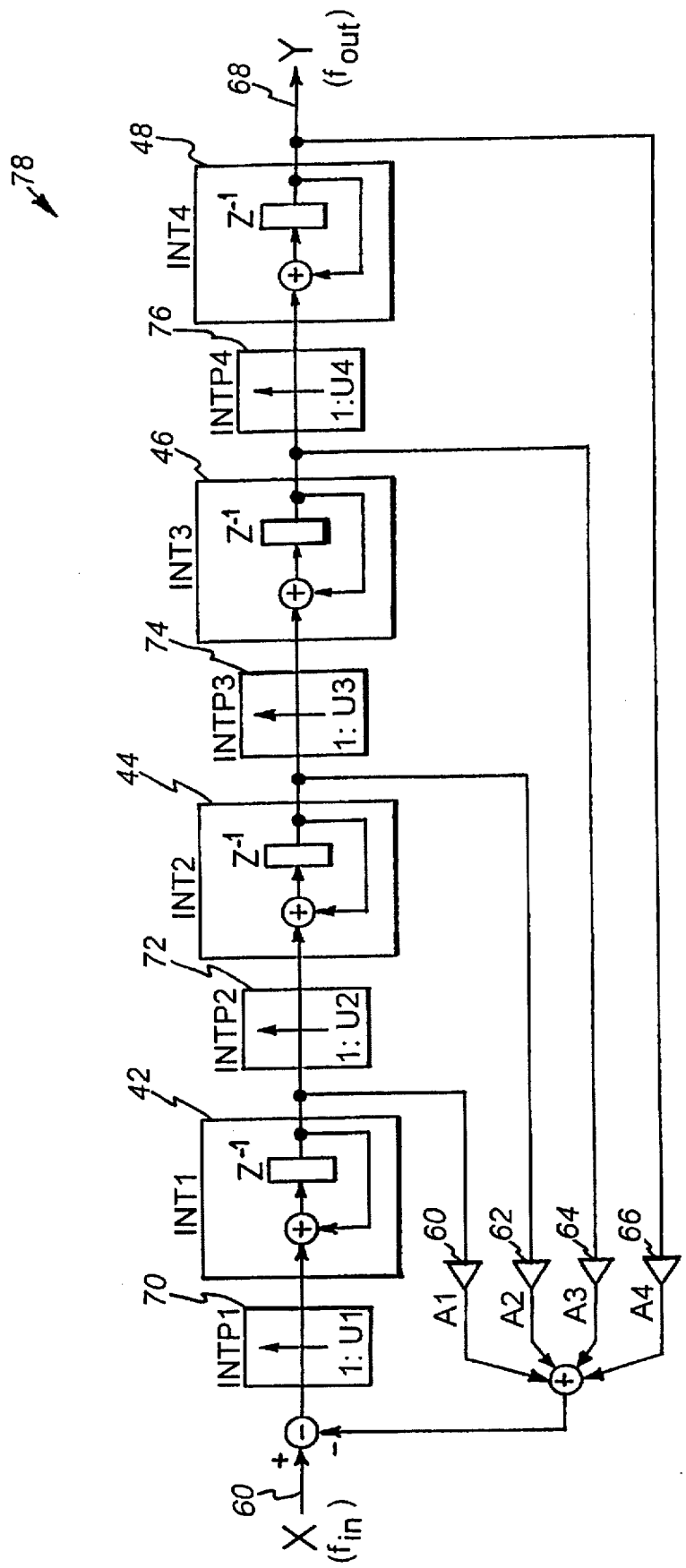
FIG. 3 is a block diagram of a fourth-order IIR interpolation filter according to the invention.

Referring to FIG. 3, an illustrative fourth-order IIR interpolation filter according to the invention differs from the structure of FIG. 2 in that the respective decimators 50, 52, 54, 56 at the outputs of the integrators 42, 44, 46, 48 are each replaced with interpolators 70, 72, 74, 76 at the inputs of these integrators. Interpolators and decimators both act as rate adjustors, with decimators decreasing the signal rate, such as by resampling, and interpolators increasing the signal rate, such as by zero-stuffing. The interpolation filter 78 also takes advantage of the fact that at the output of each of the integrators the signal is sufficiently low-pass filtered that interpolation can be performed incrementally throughout the filter by the interpolators. For this reason, only the first-stage integrator 42 needs to operate at the high input data-rate. Operations performed for the subsequent stages, including the filter coefficient multiplication by the gain elements 60, 62, 64, 66 can be performed at lower data-rates. This can have the effect of dramatically reducing computational requirements.

Figure 4:
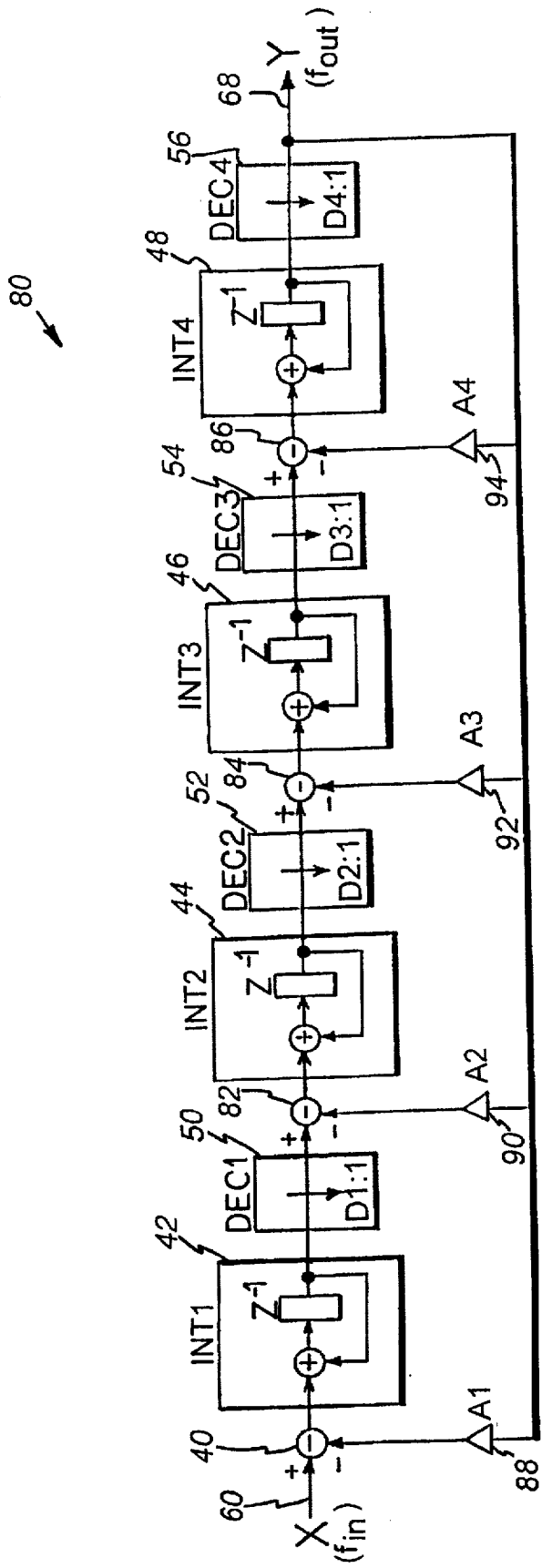
FIG. 4 is a block diagram of a second fourth-order state-variable IIR decimation filter according to the invention.

Referring to FIG. 4, an alternative fourth-order IIR decimation filter 80 differs from the embodiment of FIG. 2 in that it uses an "inverse follow-the-leader" feedback structure. In this filter, the output node 68 of the filter is fed back to the input of each of the stages, and the outputs of the first three stages are not directly fed back to the input of the first stage. Specifically, the output node 68 is operatively connected to an inverting input of the first summer 40 via a first gain element 88. The output node 68 is also operatively connected to an inverting input of a second summer 82 via a second gain element 90. The second summer has a non-inverting input operatively connected to the output of the first decimator 50, and an output operatively connected to the input of the second integrator 44. Similarly, the output node is operatively connected to inverting inputs of a third summer 84 and a fourth summer 86, via a third gain element 92 and a fourth gain element 94, respectively. The third summer 84 has a non-inverting input operatively connected to the output of the second decimator 52 and an output operatively connected to the input of the third integrator 46.

Figure 1:
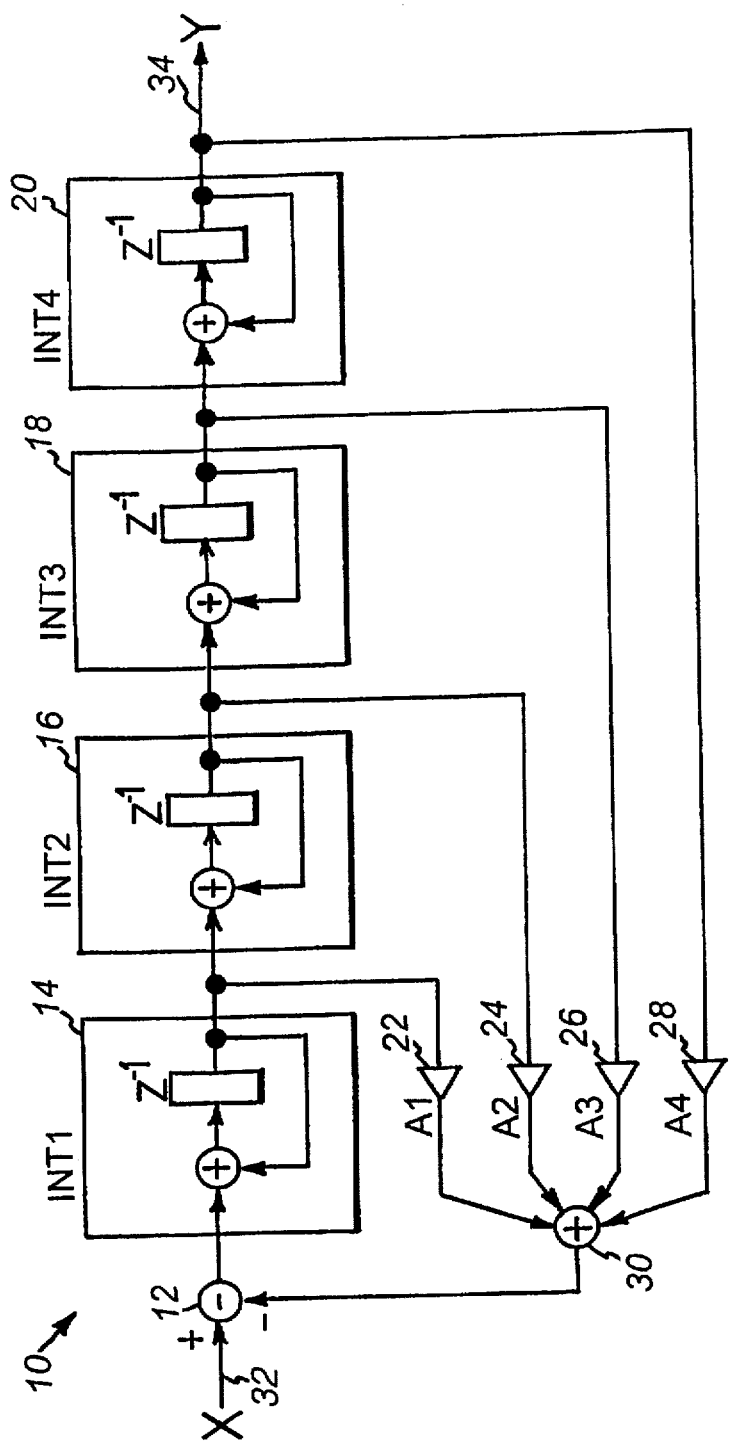
FIG. 1 is a block diagram of a prior art fourth-order state-variable IIR filter.

The fourth summer has a non-inverting input operatively connected to the output of the third decimator, and an output operatively connected to the input of the fourth integrator 48. Like the filter of FIG. 1, this filter can also exhibit a dramatically reduced computation load, particularly if each operation is implemented at the lowest allowable data-rates.

Figure 5:
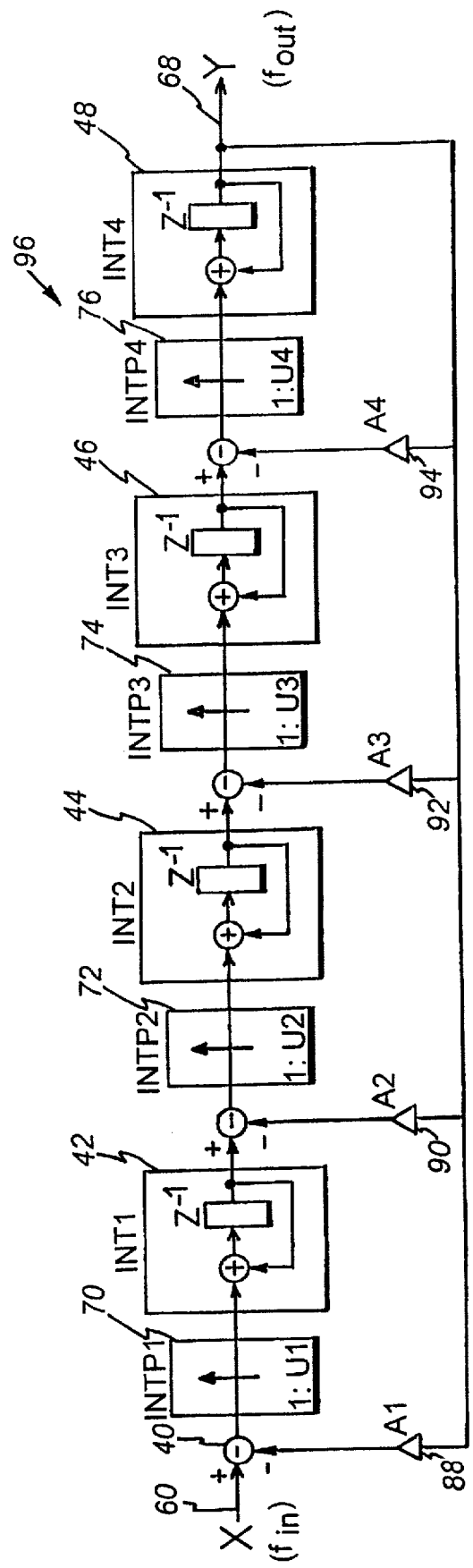
FIG. 5 is a block diagram of a second fourth-order state-variable IIR interpolation filter according to the invention.

Referring to FIG. 5, an alternative fourth-order IIR interpolation filter 96 according to the invention differs from the alternative fourth-order IIR decimation filter 80 of FIG. 4 in that the decimators 50, 52, 54, 56 at the outputs of the integrators 42, 44, 46, 48 are replaced with interpolators 70, 72, 74, 76 at the inputs of these integrators 42, 44, 46, 48. This embodiment also implements an inverse follow-the-leader feedback structure, which exhibits a dramatically reduced computation load.

Figure 6:
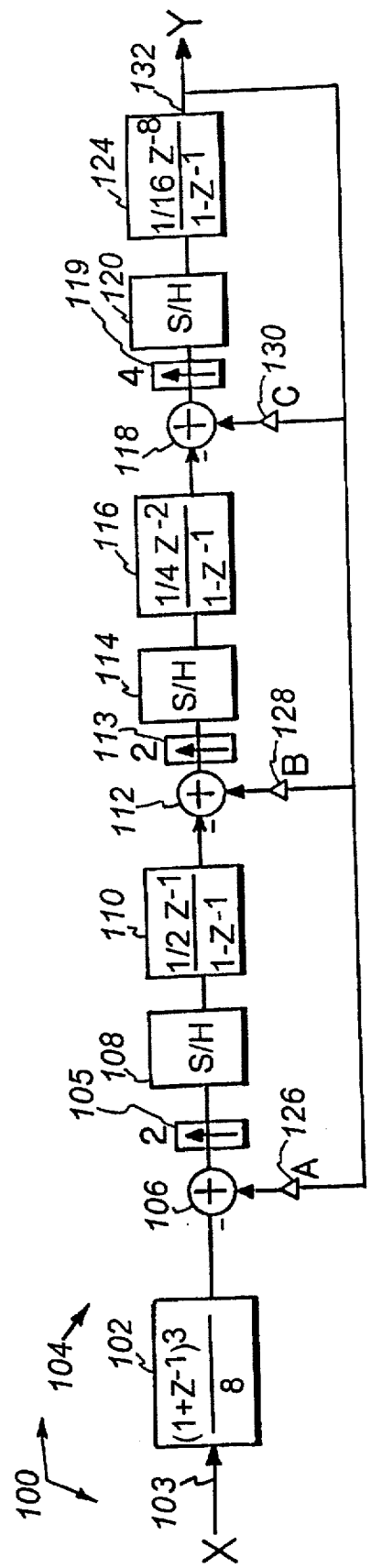
FIG. 6 is a block diagram of a third-order Chebychev low-pass IIR interpolation filter according to the invention.

Referring to FIG. 6, a low-pass filter 100 having a Chebychev frequency response and employing principles according to the invention includes a four-tap Fir filter 102 and a third-order IIR interpolation filter 104 in a cascaded configuration. The FIR filter is a four-tap FIR filter that is used to implement the three frequency response nulls at half the input sample rate and is in general not necessary in realizing a low-pass filter response. Its input 106 acts as the input of the whole filter 100, and its output is operatively connected to the input of the third-order IIR filter.

The third-order IIR filter 104 uses an inverse follow-the-leader feedback structure similar to the one shown in FIG. 5, but it is a three-stage filter, instead of a four-stage filter. In particular, its first stage includes a first interpolator 105 that implements an interpolation by a factor of two followed by a first sample-and-hold 108. The sample-and-hold has an output operatively connected to the input of a first integrator 110, which has a gain of 0.5. Similarly, the second stage has a second interpolator 113 that implements an interpolation by a factor of two followed by a second sample-and-hold 114. The output of the second sample-and-hold is provided to a second integrator 116 that has a gain of 0.25. The third stage has a third interpolator 119 that implements an interpolation by a factor of four followed by a third sample-and-hold 120. The output of The third sample-and-hold is operatively connected to the input of a third integrator 124 that has a gain of 0.0625.

The output of the third integrator 132 forms the output of the filter 100. This output is fed back to an inverting input of a first summer 106, which has a non-inverting input operatively connected to the output of the FIR filter 102, and an output operatively connected to the first sample-and-hold 108. This feedback path is provided with a first gain element 126 that has a gain of 0.03835. The output of the filter is also fed back to an inverting input of a second summer 112, which has a non-inverting input operatively connected to the output of the first integrator 110 and an output operatively connected to the input of the second sample-and-hold 114. This feedback path includes a second gain element 128 that has a gain of 0.2558. The output of the filter is additionally fed back to an inverting input of a third summer 118, which has a non-inverting input operatively connected to an output of the second integrator 116 and an output operatively connected to an input of the third sample-and-hold 120. This feedback path includes a third gain element 130 with a gain of 0.6172.

Figure 7:
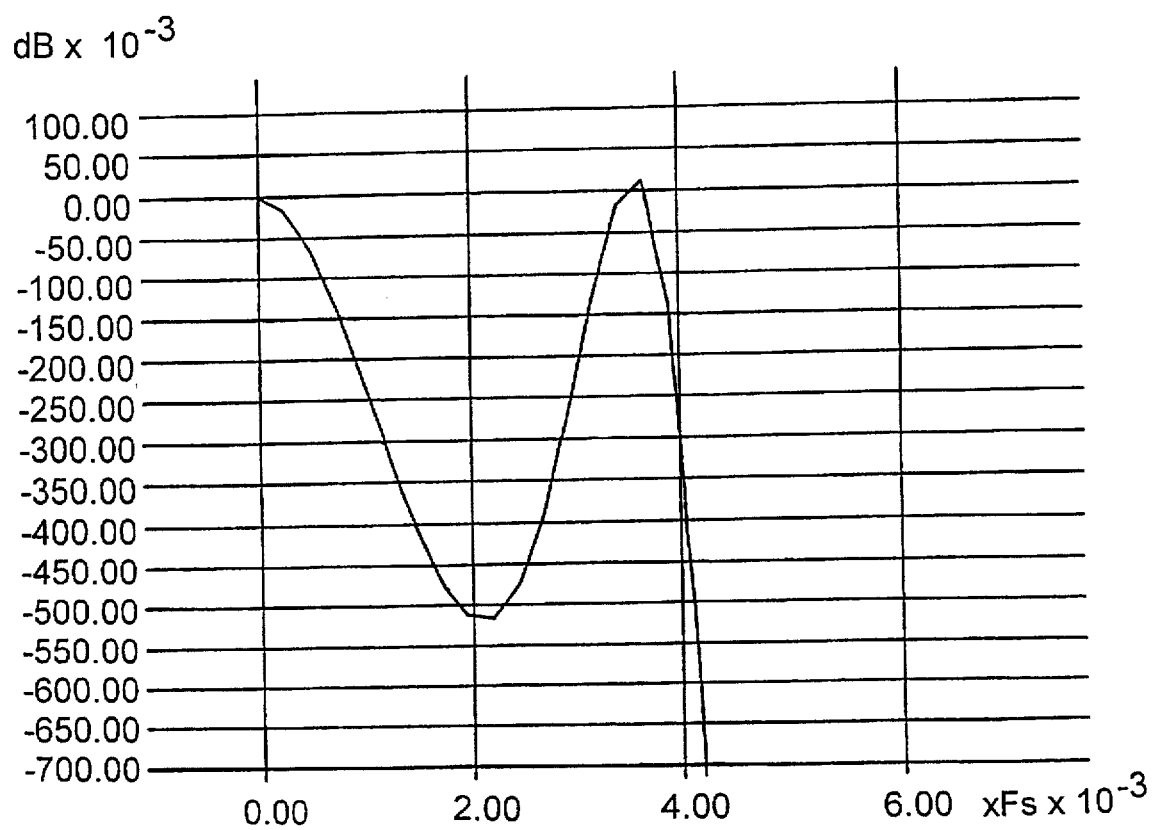
FIG. 7 is a frequency response plot of a simulation of the filter of FIG. 6.
Figure 8:
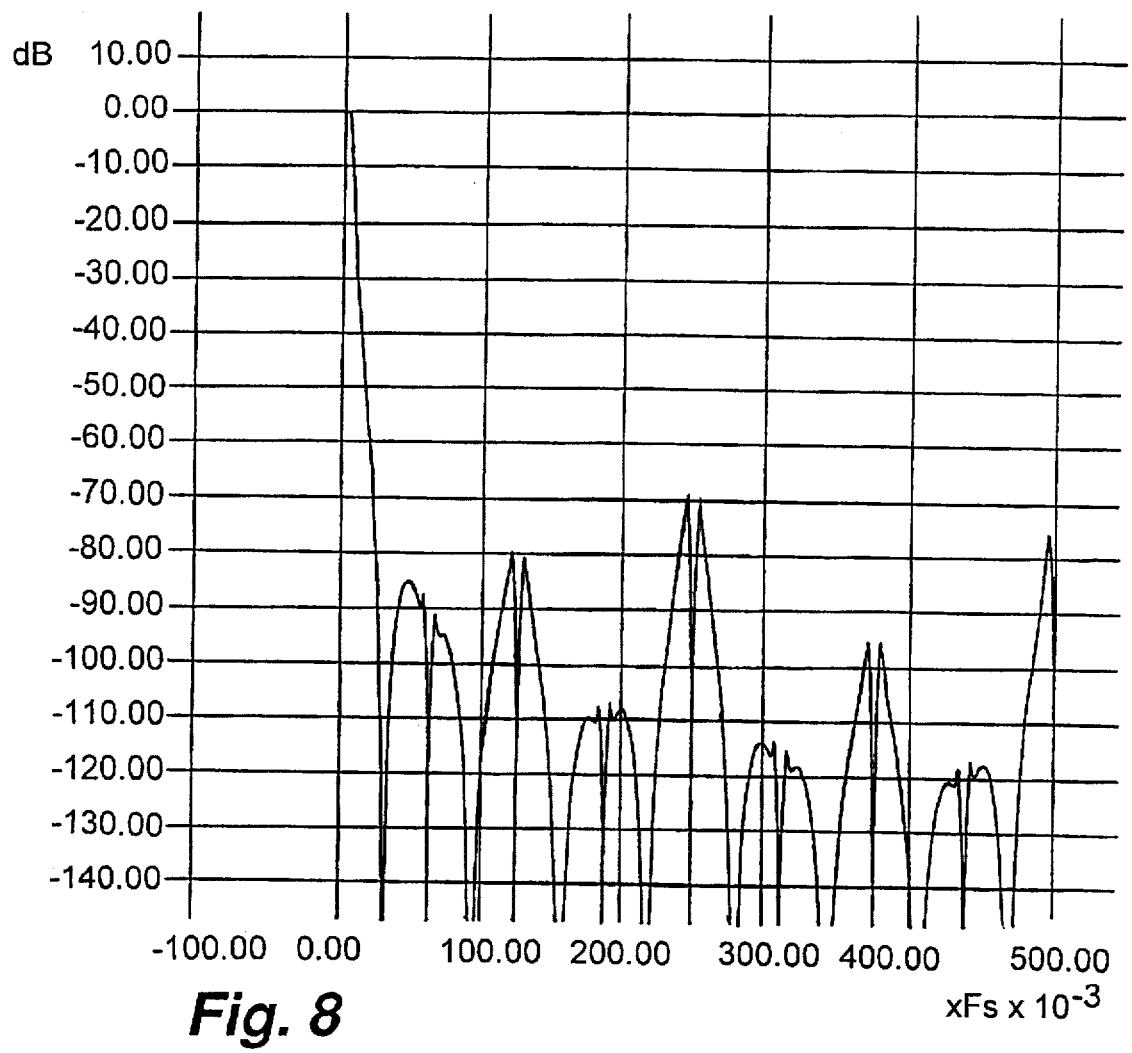
FIG. 8 is also a frequency response plot from a simulation of the filter of FIG. 6, shown for an expanded frequency range.

The frequency response of a simulation of the filter of FIG. 6 was obtained by performing a fast fourier transform (FFT) of its impulse response, and is shown in FIGS. 7 and 8. As can be seen, the filter implements a −70 dB worst-case Chebychev filter that exhibits a sharp cut-off very close to the sampling frequency (Fs). This filter is particularly advantageous in that it can be implemented in a very small area of an integrated circuit. Because of the three separate interpolation steps, the bulk of the computations will be made in the third stage, whereas the first two stages will require significantly less computational resources. Furthermore, this structure does not require a significant amount of random-access memory as do FIR filters with an equivalent frequency response.

As discussed above, the filters 36, 78, 80, 96 of FIGS. 2, 3, 4, 5, and 6 can each be implemented with analog switched capacitor circuitry. Some of the stages of such circuitry could be operated at lower clock rates, which can reduce power consumption. Some active components such as operational amplifiers can also be time-multiplexed to save area. Filters according to the invention can also be implemented with a microcoded data-path that uses standard arithmetic and register units, or it can be performed with special purpose routines in a general-purpose digital signal processor. In these embodiments, a full parallel multiplier can be avoided by using shift-and-hold operations to perform the multiply operations. Of course, the first and second summers can be combined in the follow-the-leader filters.

As is apparent from the above embodiments, an interpolation operation can be followed by a sample-and-hold operation. It is noted that a filter that has an interpolator before an integrator can be replaced with an integrator followed by an interpolator and then a sample-and-hold. This replacement can be beneficial in that the integrator can operate at a lower rate because it is placed before the interpolator. Although interpolation and sample-and-hold operations are considered separate signal processing operations, in certain implementations (e.g., digital ones), they can both be performed in one operation by an interpolator.

IIR filters according to the invention can be used in situations where an output is required from the filter at times other than those dictated by the output data rate. This can allow such filters to be used in connection with signals that include some jitter. For example, in the above-referenced copending application entitled DATA ACQUISITION SYSTEM, an IIR filter is used for converting signals from a computed tomography scanner, which provides, convert pulses that include some jitter due to factors such as motor speed variations. Intermediate filter output values are obtained at the time a convert pulse is received from a linear interpolation between adjacent output values.

It is also possible in the above embodiments to provide rate adjustors in the feedback paths, rather than in the forward signal paths. Such a system would still benefit from efficiency improvements, because the gain elements in the feedback paths would operate at lower rates, but gain elements in the signal path would not operate at these lower rates. First, second, third, fourth, fifth, and higher order structures are contemplated for filters employing principles of the invention.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An IIR filter, comprising:
    a first integrator having an input and an output,
    a first summer, a first rate adjustor having an input and an output, wherein the first rate adjustor is a first decimator, a first circuit path between the input of the first rate adjustor and the output of the first integrator, and a second circuit path between the output of the first rate adjustor and the input of the first integrator, wherein the second circuit path includes a third circuit path between the output of the first decimator and a first input of the first summer, and wherein the second circuit path also includes a fourth circuit path between an output of the first summer and the input of the first integrator.

2. The apparatus of claim 1 wherein the first integrator is constructed and adapted to operate at a first rate, wherein the third circuit path further includes a gain element that is constructed and adapted to operate at a second rate, and wherein the first and second rates are different.

3. The apparatus of claim 1 wherein the first circuit path further includes:

a second decimator having an input operatively connected to the output of the first integrator, a second integrator having an output operatively connected to the input of the first decimator, a fifth circuit path between the output of the second decimator and a second input of the first summer, and a sixth circuit path between the output of the second decimator and the input of the second integrator.

4. The apparatus of claim 3 wherein the first integrator is implemented with switched-capacitor circuitry.

5. The apparatus of claim 3 wherein the first integrator is constructed and adapted to operate at a first rate, wherein the second integrator is constructed and adapted to operate at a second rate, and wherein the first and second rates are different.

6. The apparatus of claim 5 wherein the first integrator is implemented with switched-capacitor circuitry.

7. The apparatus of claim 3 wherein the third circuit path further includes a first gain element that is constructed and adapted to operate at a first rate, wherein the fifth circuit path further includes a second gain element that is constructed and adapted to operate at a second rate, and wherein the first and second rates are different.

8. The apparatus of claim 3 wherein the sixth circuit path further includes:

a third integrator having an input operatively connected to the output of the second decimator, a third decimator having an input operatively connected to an output of the third integrator, and an output operatively connected to the input of the second integrator, and a seventh circuit path between the output of the third decimator and a third input of the first summer.

9. The apparatus of claim 1 wherein the first circuit path further includes:

a second decimator having an input operatively connected to the output of the first integrator, a second summer having a first input operatively connected to an output of the second decimator, a second integrator having an output operatively connected to the input of the first decimator, a fifth circuit path between the output of the first decimator and a second input of the second summer, and a sixth circuit path between the output of the second summer and the input of the second integrator.

10. The apparatus of claim 9 wherein the first integrator is implemented with switched-capacitor circuitry.

11. The apparatus of claim 9 wherein the first integrator is constructed and adapted to operate at a first rate, wherein the second integrator is constructed and adapted to operate at a second rate, and wherein the first and second rates are different.

12. The apparatus of claim 11 wherein the first integrator is implemented with switched-capacitor circuitry.

13. The apparatus of claim 9 wherein the third circuit path further includes a first gain element that is constructed and adapted to operate at a first rate, wherein the fifth circuit path further includes a second gain element that is constructed and adapted to operate at a second rate, and wherein the first and second rates are different.

14. The apparatus of claim 9 wherein the sixth circuit path further includes:

a third integrator having an input operatively connected to the output of the second summer, a third decimator having an input operatively connected to an output of the third integrator, a third summer having a first input operatively connected to an output of the third decimator, and an output operatively connected to the input of the second integrator, and a seventh circuit path between the output of the first decimator and a second input of the third summer.

15. The apparatus of claim 2 wherein the first integrator is implemented with switched-capacitor circuitry.

16. An IIR filter, comprising:

a first integrator having an input and an output, a first summer, a first rate adjustor having an input and an output, wherein the first rate adjustor is a first interpolator, a first circuit path between the input of the first rate adjustor and the output of the first integrator, wherein the first circuit path includes a third circuit path between the output of the first integrator and a first input of the first summer, and wherein the first circuit path also includes a fourth circuit path between an output of the first summer and the input of the first interpolator, and a second circuit path between the output of the first rate adjustor and the input of the first integrator.

17. The apparatus of claim 16 wherein the interpolator further includes an interpolation stage operatively connected to the input of the interpolator and a sample-and-hold stage operatively connected between the output of the interpolator stage and the output of the interpolator.

18. The apparatus of claim 16 wherein the interpolator is constructed and adapted to perform an interpolation and a sample-and-hold operation.

19. The apparatus of claim 16 wherein the first integrator is constructed and adapted to operate at a first rate, wherein the third circuit path further includes a gain element that is constructed and adapted to operate at a second rate, and wherein the first and second rates are different.

20. The apparatus of claim 16 wherein the second circuit path further includes:

a second integrator having an input operatively connected to the output of the first interpolator, a second interpolator having an output operatively connected to the input of the first integrator, a fifth circuit path between the output of the second interpolator and a second input of the first summer, and a sixth circuit path between the output of the second integrator and the input of the second interpolator.

21. The apparatus of claim 20 wherein the interpolators each further include an interpolation stage operatively connected to the input of the interpolator and a sample-and-hold stage operatively connected between the output of the interpolator stage and the output of that interpolator.

22. The apparatus of claim 20 wherein the interpolators are each constructed and adapted to perform an interpolation and a sample-and-hold operation.

23. The apparatus of claim 20 wherein the first integrator is implemented with switched-capacitor circuitry.

24. The apparatus of claim 20 wherein the first integrator is constructed and adapted to operate at a first rate, wherein the second integrator is constructed and adapted to operate at a second rate, and wherein the first and second rates are different.

25. The apparatus of claim 24 wherein the first integrator is implemented with switched-capacitor circuitry.

26. The apparatus of claim 20 wherein the third circuit path further includes a first gain element that is constructed and adapted to operate at a first rate, wherein the fifth circuit path further includes a second gain element that is constructed and adapted to operate at a second rate, and wherein the first and second rates are different.

27. The apparatus of claim 20 wherein the sixth circuit path further includes:
   a third interpolator having an input operatively connected to the output of the second integrator,
   a third integrator having an input operatively connected to an output of the third interpolator, and an output operatively connected to the input of the second interpolator, and
   a seventh circuit path between the output of the third interpolator and a third input of the first summer.

28. The apparatus of claim 16 wherein the first circuit path further includes:
   a second integrator having an input operatively connected to the output of the first interpolator,
   a second summer having an input operatively connected to an output of the second integrator,
   a second interpolator having an output operatively connected to the input of the first integrator,
   a fifth circuit path between the output of the first integrator and a second input of the second summer, and
   a sixth circuit path between the output of the second summer and the input of the second interpolator.

29. The apparatus of claim 28 wherein the interpolators each further include an interpolation stage operatively connected to the input of the interpolator and a sample-and-hold stage operatively connected between the output of the interpolator stage and the output of that interpolator.

30. The apparatus of claim 28 wherein the interpolators are each constructed and adapted to perform an interpolation and a sample-and-hold operation.

31. The apparatus of claim 28 wherein the first integrator is implemented with switched-capacitor circuitry.

32. The apparatus of claim 28 wherein the first integrator is constructed and adapted to operate at a first rate, wherein the second integrator is constructed and adapted to operate at a second rate, and wherein the first and second rates are different.

33. The apparatus of claim 32 wherein the first integrator is implemented with switched-capacitor circuitry.

34. The apparatus of claim 28 wherein the third circuit path further includes a first gain element that is constructed and adapted to operate at a first rate, wherein the fifth circuit path further includes a second gain element that is constructed and adapted to operate at a second rate, and wherein the first and second rates are different.

35. The apparatus of claim 28 wherein the sixth circuit path further includes:
   a third interpolator having an input operatively connected to an output of the third integrator,
   a third integrator having an input operatively connected to an output of the third interpolator,
   a third summer having a first input operatively connected to an output of the third integrator, and an output operatively connected to the input of the second integrator, and
   a seventh circuit path between the output of the first interpolator and a second input of the third summer.

36. The apparatus of claim 16 wherein the first integrator is implemented with switched-capacitor circuitry.

37. A digital filtering method for filtering an input signal, comprising the steps of:
   sampling a first signal at a first rate,
   integrating the sampled first signal to provide an integrated version of the first signal,
   sampling the integrated version of the first signal at a second rate, wherein the first and second rates are different,
   combining the sampled integrated version of the first signal with the input signal to obtain the first signal,
   again integrating the integrated version of the first signal to provide a twice integrated version of the first signal,
   sampling the twice integrated version of the first signal at a third rate, wherein the first, second, and third rates are different, and
   combining the twice integrated version of the first signal with the integrated version of the first signal and the input signal.

38. The method of claim 37 wherein the step of sampling the integrated version is performed with a second rate that is lower than the first rate.

39. The method of claim 37 wherein the step of sampling the integrated version is performed with a second rate that is higher than the first rate.

40. The method of claim 39 further including a sample and hold step performed after one of the steps of sampling.

41. A digital filtering method for filtering an input signal, comprising the steps of:
   sampling a first signal at a first rate,
   integrating the sampled first signal to provide an integrated version of the first signal,
   sampling the integrated version of the first signal at a second rate, wherein the first and second rates are different,
   combining the sampled integrated version of the first signal with the input signal to obtain the first signal,
   again integrating the integrated version of the first signal to provide a twice integrated version of the first signal,
   sampling the twice integrated version of the first signal at a third rate, wherein the first, second, and third rates are different, and
   combining the twice integrated venison of the first signal with the intergrated version of the first signal.

42. The method of claim 41 wherein the step of sampling the integrated version is performed with a second rate that is lower than the first rate.

43. The method of claim 41 wherein the step of sampling the integrated version is performed with a second rate that is higher than the first rate.

44. The method of claim 43 further including a sample and hold step performed after one of the steps of sampling.

45. A digital filtering method for filtering an input signal, comprising the steps of:

sampling a first signal at a first rate, integrating the sampled first signal to provide an integrated version of the first signal, sampling the integrated version of the first signal at a second rate, wherein the first and second rates are different, combining the sampled integrated version of the first signal with the input signal to obtain the first signal again integrating the integrated version of the first signal to provide a twice integrated version of the first signal, and time-multiplexing a common circuit component to participate in both the steps of integrating and again integrating.

46. The method of claim 45 wherein the step of sampling the integrated version is performed with a second rate that is lower than the first rate.

47. The method of claim 45 wherein the step of sampling the integrated version is performed with a second rate that is higher than the first rate.

48. The method of claim 47 further including a sample and hold step performed after one of the steps of sampling.

* * * * *